(12) United States Patent
Raubo et al.

(10) Patent No.: US 8,896,023 B2
(45) Date of Patent: Nov. 25, 2014

(54) SILICON DEVICES/HEATSINKS STACK ASSEMBLY AND A METHOD TO PULL APART A FAULTY SILICON DEVICE IN SAID STACK ASSEMBLY

(71) Applicant: ALSTOM Technology Ltd, Baden (CH)

(72) Inventors: Roman Raubo, Downingtown, PA (US); Marek Furyk, Boyertown, PA (US); John Schwartzenberg, Maple Glen, PA (US)

(73) Assignee: ALSTOM Technology Ltd, Baden (CH)

( * ) Notice: Subject to any disclaimer, the term of this patent is extended or adjusted under 35 U.S.C. 154(b) by 0 days.

(21) Appl. No.: 13/772,296

(22) Filed: Feb. 20, 2013

(65) Prior Publication Data
US 2014/0231869 A1    Aug. 21, 2014

(51) Int. Cl.
*H01L 23/40* (2006.01)
*H01L 23/58* (2006.01)
*H01L 23/48* (2006.01)

(52) U.S. Cl.
CPC ............... *H01L 23/58* (2013.01); *H01L 23/48* (2013.01)
USPC ............................. 257/173; 257/706; 257/707

(58) Field of Classification Search
CPC ... H01L 21/486; H01L 21/50; H01L 23/3677; H01L 23/367; H01L 23/34; H01L 23/13; H01L 23/433; H01L 23/4006
USPC ......... 257/622, 686, 706, 707, 712, 713, 723, 257/777, E23.083, E23.085; 361/676, 717, 361/679.01–820; 438/107, 123
See application file for complete search history.

(56) References Cited

U.S. PATENT DOCUMENTS

| | | | | |
|---|---|---|---|---|
| 1,860,069 | A * | 5/1932 | Bird | 257/658 |
| 2,114,898 | A * | 4/1938 | Dormoy | 257/726 |
| 3,603,381 | A * | 9/1971 | Scherbaum et al. | 165/80.4 |
| 4,779,812 | A * | 10/1988 | Fisher et al. | 242/434.7 |
| 4,989,070 | A * | 1/1991 | Iversen et al. | 257/712 |
| 5,811,877 | A * | 9/1998 | Miyano et al. | 257/706 |
| 5,940,271 | A * | 8/1999 | Mertol | 361/704 |
| 6,677,673 | B1 * | 1/2004 | Hitchcock | 257/718 |
| 2002/0185723 | A1 * | 12/2002 | Yamaguchi et al. | 257/686 |
| 2011/0134609 | A1 * | 6/2011 | Folts | 361/717 |

* cited by examiner

*Primary Examiner* — Davienne Monbleau
*Assistant Examiner* — Herve Assouman
(74) *Attorney, Agent, or Firm* — Nixon Peabody LLP

(57) ABSTRACT

The invention concerns a silicon devices/heatsinks stack assembly and a method to pull apart a faulty silicon device in said stack assembly. Said silicon devices/heatsinks stack assembly comprises an arrangement of many silicon devices disks, two adjacent silicon devices disks being separated by a flat heatsink device, each silicon device disk and each heatsink comprising a centering hole on its both faces, a centering pin placed between the adjacent centering holes of a silicon device disk and an adjacent heatsink device. Each heatsink device is pierced with two guide holes, at two opposite ends of this one.

11 Claims, 7 Drawing Sheets

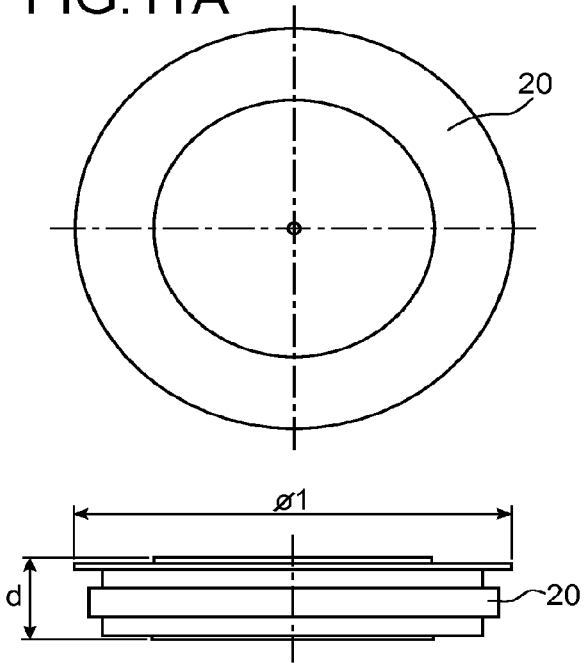
FIG.11A
FIG.11B
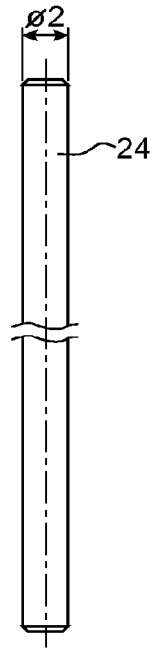
FIG.12
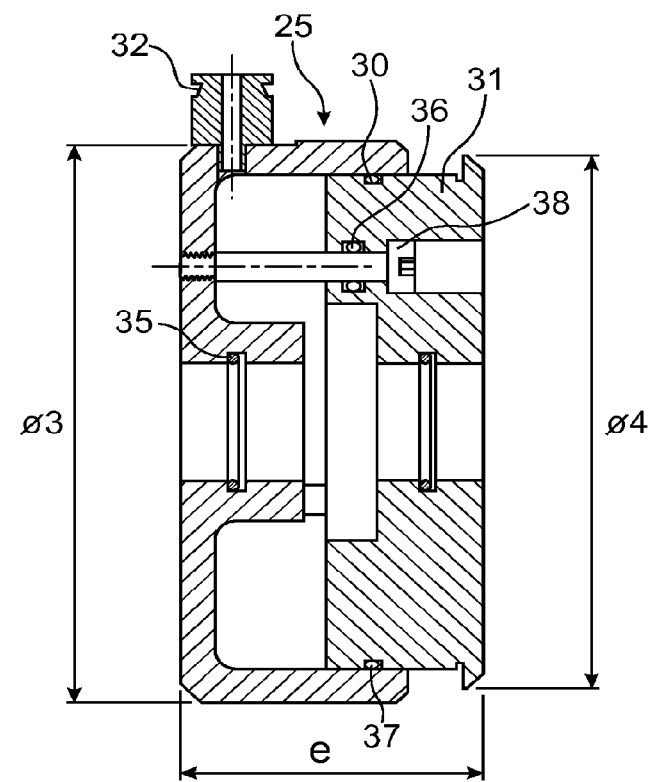
FIG.13

SILICON DEVICES/HEATSINKS STACK ASSEMBLY AND A METHOD TO PULL APART A FAULTY SILICON DEVICE IN SAID STACK ASSEMBLY

BACKGROUND OF THE INVENTION

1. Field of the Invention

This invention relates to a silicon devices/heatsinks stack assembly and a method to pull apart a faulty silicon device in said stack assembly retaining the silicon devices alignment during its replacement. In the following, we will consider that silicon devices are thyristors.

2. Description of the Related Art

In the field of electric power engineering and electric power transmission, a SVC (Static VAR Compensator) is used in the industrial and utility applications to increase power quality factors on the distribution and transmission lines. A key component of such a device is a thyristor valve. A thyristor valve is comprised of following components:
- a stack of layered sets of heatsinks and thyristors, comprising:
  - thyristors, which are silicon devices, allowing control of the current flow via the thyristor valve,
  - heatsinks, which are mechanical devices allowing removal of the heat from the thyristors, driven by conduction and switching losses, thus being able to operate the thyristor valve within a wide range of voltages and currents,
- auxiliary circuits as snubber circuits, gate drives, gate drive energy delivery systems allowing to reliably control the thyristor valve within specified application ranges.

So said thyristor valve is built from the layered stack of thyristors packaged in the hockey puck (or disk) type of package and heatsinks Any other silicon devices packaged in this form factor can be utilized in the stack assembly, for example: rectifier diodes, bidirectional thyristors, IGBT's, triacs.

Such assemblies are also used in TCR (Thyristor Controlled Reactor) and TSC (Thyristor Switched Capacitor) valves for static VAR Compensators (SVC), in TCSC (Thyristor Controlled Series Capacitor) valves, and HVDC modules.

A thyristors/heatsinks stack assembly comprises multiple arrangements of thyristors disks and heatsinks devices in which each thyristor disk is separated from a next thyristor disk by a medium cooled heatsink device. Heatsinks devices may be composed of aluminium blocks with a special grid of flow channels, allowing a cooling medium (coolant, mostly a mixture of water and glycol) to flow through them. A thyristor disk is compressed between two heatsinks devices, thus having a close contact to the heatsink devices surface and the cooling medium flowing through it. Heat generated by thyristor disks is then removed by adjacent heatsink devices and transferred into the cooling medium and evacuated to heat exchangers, mounted outside of the thyristor valve.

The size of the stack assembly depends of the number of thyristor disks forming it. The number of stacked thyristor disks is determined by the thyristor valve electrical ratings: minimum, maximum, nominal voltage withstand, minimum, maximum, nominal thyristor valve current. Usually, there are between 3 and 30 thyristors in a stack assembly. The length of such a stack assembly can reach up to 2 meters.

A potential mechanical failure of thyristors/heatsinks stack assembly during maintenance procedures is identified as a potential problem.

Whenever there is a need to replace a faulty thyristor, the thyristors/heatsinks stack assembly has to be separated to accommodate removal and replacement of the faulty thyristor using spreaders, in breaking the alignment of the stack assembly. Lack of this alignment poses a potential threat for either a misalignment of the stack during reassembly, causing thyristor damage, or for a full collapse of the stack. This is especially true in the case of valve arrangements where the stack is mounted in a horizontal position.

As shown on FIG. 1, a conventional vertical thyristors/heatsinks stack assembly comprises an alternating stack of thyristor disks 10 and heatsink devices 11. The total number of stacked thyristors disks and heatsink devices can be up to 30 in one assembly. A properly assembled thyristors/heatsinks stack assembly has well aligned thyristors disks and heatsink devices. Typically, both thyristors disks and heatsink devices are equipped with centering holes 12. During the assembly a centering pin is placed in the two adjacent centering holes 12 allowing proper mechanical alignment, along an alignment path 13, between thyristor disks 10 and heatsink devices 11. However, maintaining the proper alignment becomes very challenging during a process of replacing any of the thyristor disks 10 in the assembled stack, as shown in FIG. 2, due to the fact that a standard spreader tool used during this process do not guarantee keeping in alignment remaining thyristor disks 10 and heatsink devices 11. So removal of a faulty thyristor disk may be accomplished by using an hydraulic or air actuated spreader tool to separate two heatsinks devices which are in contact with the faulty thyristor disk whilst retaining sufficient clamping on the other thyristor disks. On FIG. 2 a missing alignment path 14 is shown while a thyristor disk 10, which was positioned in the space shown by reference 15, is being replaced.

Alignment difficulties are even more pronounced during the assembly and replacement of thyristor disks in an horizontal thyristors/heatsinks stack assembly. The weight of the stack causes additional issue as thyristors/heatsinks stack assembly is being divided in two separate subassemblies. FIG. 3 show an horizontal thyristors/heatsinks stack assembly.

Until now, conventional methods and solutions of maintaining the alignment of the thyristors/heatsinks stack assembly do not provide a 100% assurance of retaining that alignment while a faulty thyristor is being replaced.

A prior art spreading method, used in a vertical stack configuration, relies on assumption that vertical configuration does not produce horizontal forces that could dislodge both subassemblies of the stack assembly. Due to the weight of the upper subassembly, there is a possibility of an horizontal shift due to forces exerted by the spreading tools. The skill of the technician greatly influences the final results of the alignment. Lack of which potentially could be a cause for damaged thyristor and faulty valve.

Such a prior art spreading method is represented on FIG. 4-5B. Reference 40 shows centering pin/thyristor centering hole mismatch. On each side of a faulty thyristor 43, a spreading tool 44 is used to pull apart the next heatsinks 11 to remove this faulty thyristor 43 and to replace it. Said spreading tool 44 comprises a first part 45 with an interior chamber, a second part 46 moving in said interior chamber to form an adjustable spreading actuator. A centering pin 41 and a corresponding centering hole 42 are represented on FIG. 5B which corresponds to detail A of FIG. 5A.

Such a prior art spreading method has the following deficiencies:
- Used spreading actuators are very bulky. Therefore it is difficult to fit these actuators into the stack assembly.

Spreading actuators are in special conflict with the stack assembly components. So thyristor replacement is very difficult and lengthy.

Spreading actuators in their active state always have slightly different force vectors on each side of the thyristor assembly. The result is out of the alignment centering pin, centering hole positions.

Alignment of the centering pins/holes is only possible after several trials and careful adjustments of both spreading actuators.

A prior art spreading method, used in a horizontal stack configuration, relies on presence of conventional « made to fit » support spacers, furthering and stabilizing the thyristors/heatsinks stack assembly. Accuracy of the alignment depends greatly on the skills of technician performing this work and is prone to errors, both in the setup stage as well as during a faulty thyristor replacement process. Since both separated subassemblies of the stack are not connected, any unwanted movement will cause a loss of alignment. Furthermore, spreading tools used to separate both subassemblies of the stack assembly could potentially cause an unintended horizontal shift of the stack assembly, which in turn might lead to total loss of alignment on all stack components.

The above prior art solutions are expensive, unreliable and require at least two trained technicians to perform such a work. In case of possible failure to maintain the alignment, thyristors/heatsinks stack assembly has to be rebuilt, which would require an additional time and work to complete the task.

So a technical problem to be solved is the following one. Misalignment of the thyristors within the thyristors/heatsinks stack assembly could cause the damage to the thyristor, or could possibly be a cause for total collapse of the thyristors/heatsinks stack assembly, especially if the quantity of thyristors within the stack is increased. Moreover, during a thyristor replacement procedure, there must be provision to maintain the continuum of the alignment path of the thyristors/heatsinks stack assembly, even when a faulty thyristor is removed and the stack is divided into two separated subassemblies.

The purpose of the invention is to provide a silicon devices/heatsinks stack assembly and a method to pull apart a faulty silicon device in said stack assembly in retaining a full alignment of the silicon devices/heatsinks stack assembly during a silicon device replacement procedure, regardless of the silicon devices/heatsinks stack assembly orientation, which may be horizontal or vertical.

SUMMARY OF THE INVENTION

The invention concerns a silicon devices/heatsinks stack assembly comprising an arrangement of many silicon devices disks, two adjacent thyristor disks being separated by a flat heatsink device, each silicon device disk and each heatsink device comprising a centering hole on its both faces, a centering pin being placed between the adjacent centering holes of a silicon device disk and an adjacent heatsink device, characterized in that each heatsink device is pierced with two guide holes, at two opposite ends of this one.

Advantageously each silicon device is a thyristor.

Said stack assembly can be used in a vertical or an horizontal stack configuration.

The invention also concerns a method to pull apart a faulty thyristor in the thyristors/heatsinks stack assembly, wherein two guide rods are inserted through the guide holes, with spreader tools placed to both sides of the faulty thyristor, and wherein compressed medium, for example air or liquid, is applied to the spreader tools to cause heatsink disks that are located near the faulty thyristor to pull apart, freeing it for the removal and replacement.

Advantageously each spreader tool has a cylindrical form and comprises an air pressure chamber, a retractably piston and an air input, a center guide axis, which is a guide rod. Compressed air is used as medium to impart a force on the piston.

The proposed solution of a self-guided method has the following key advantages:

100% assurance of the alignment of the thyristor/heatsinks stack assembly, not dependent on the technician skills, no required pre-alignment and adjustment during a thyristor removal process, less time consuming: the invention greatly reducing assembly time during thyristor valve production process, and greatly simplifying thyristor change process, only one person being required to perform thyristor replacement procedure, universal spreader tools which can be re-used on other projects if needed.

BRIEF DESCRIPTION OF THE DRAWINGS

FIG. 11A-FIG. 13 show the features of an embodiment of the invention thyristors/heatsinks stack assembly.

DESCRIPTION OF THE PREFERRED EMBODIMENTS

Figure 1:
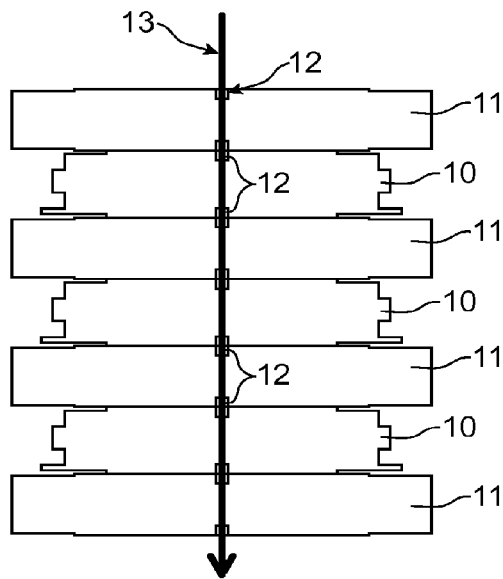
FIGS. 1 and 2 show a conventional vertical thyristors/heatsinks stack assembly, respectively in a longitudinal section and in a side view.
Figure 2:
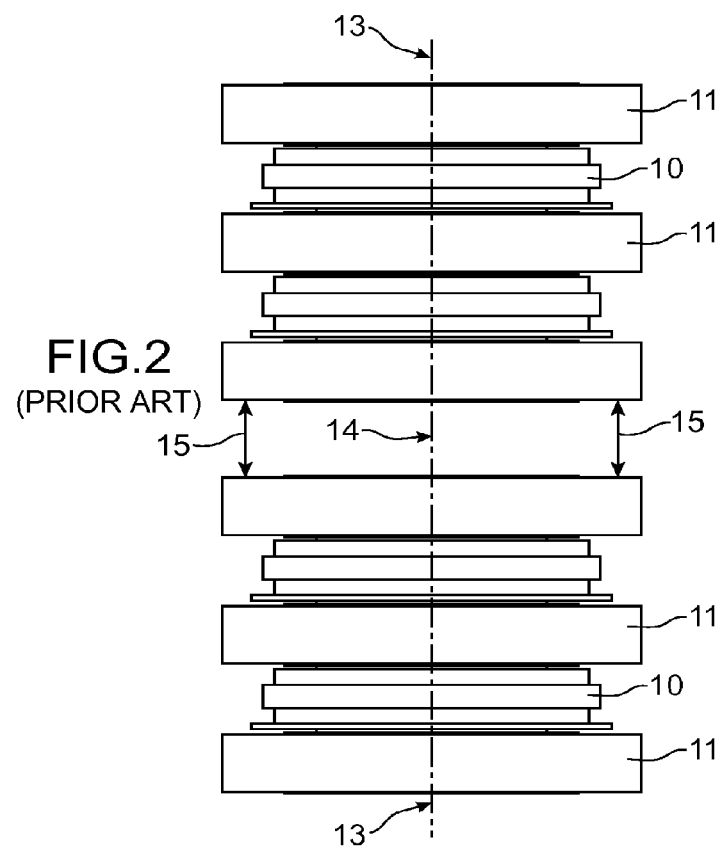
Figure 3:
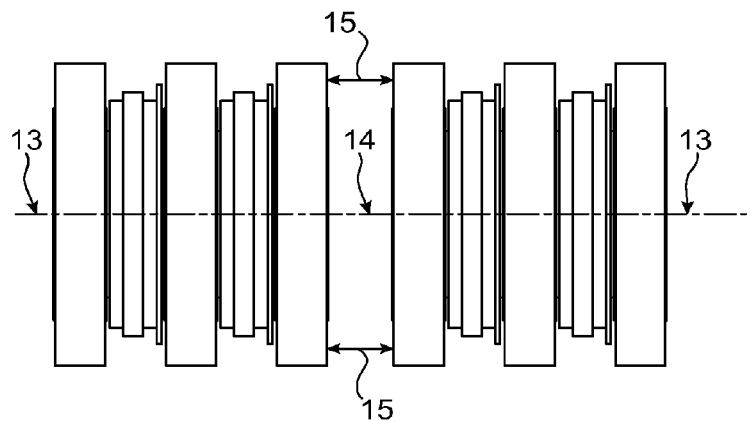
FIG. 3 shows a side view of a conventional horizontal thyristors/heatsinks stack assembly.
Figure 4:
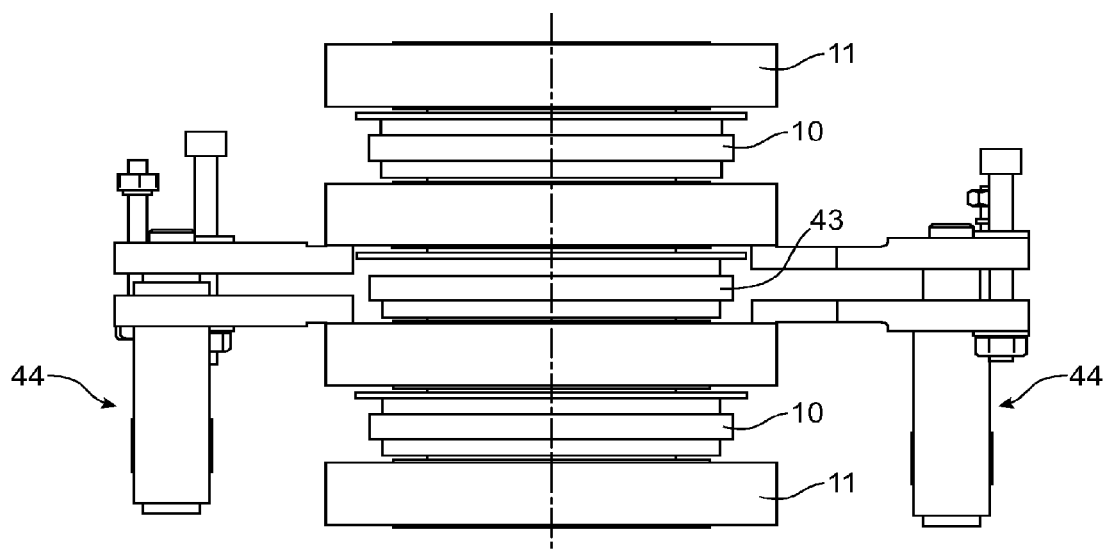
FIG. 4-FIG. 5B show a prior art method.
Figure 5A:
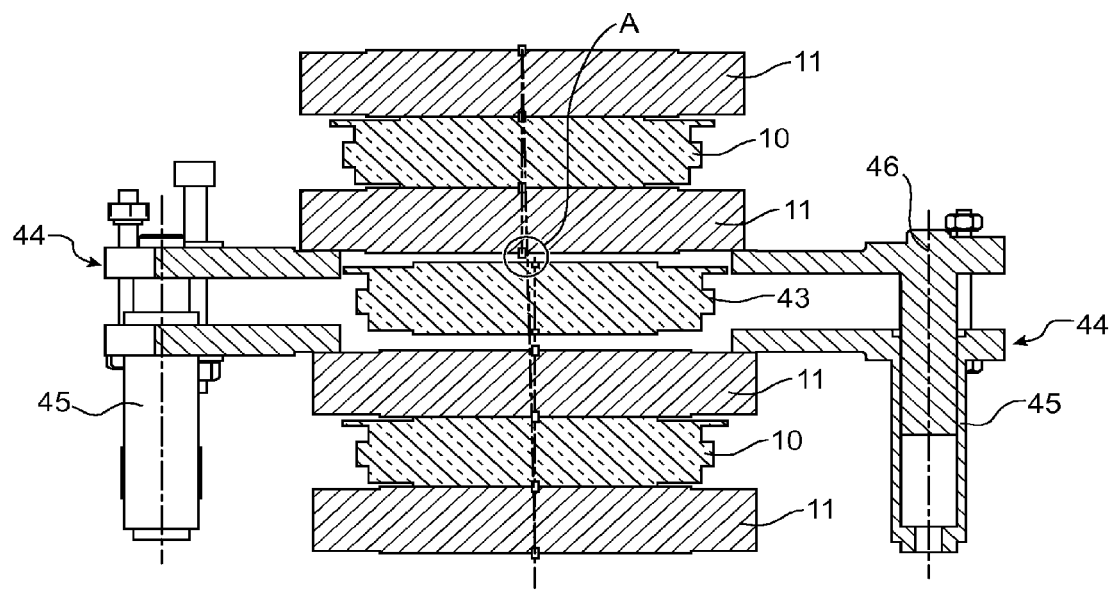
Figure 5B:
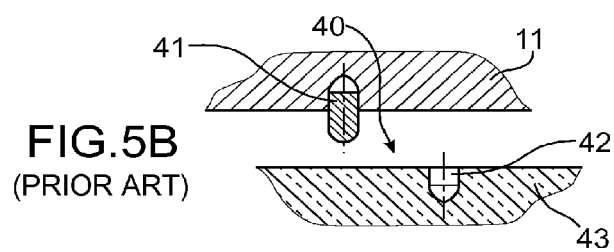
Figure 6:
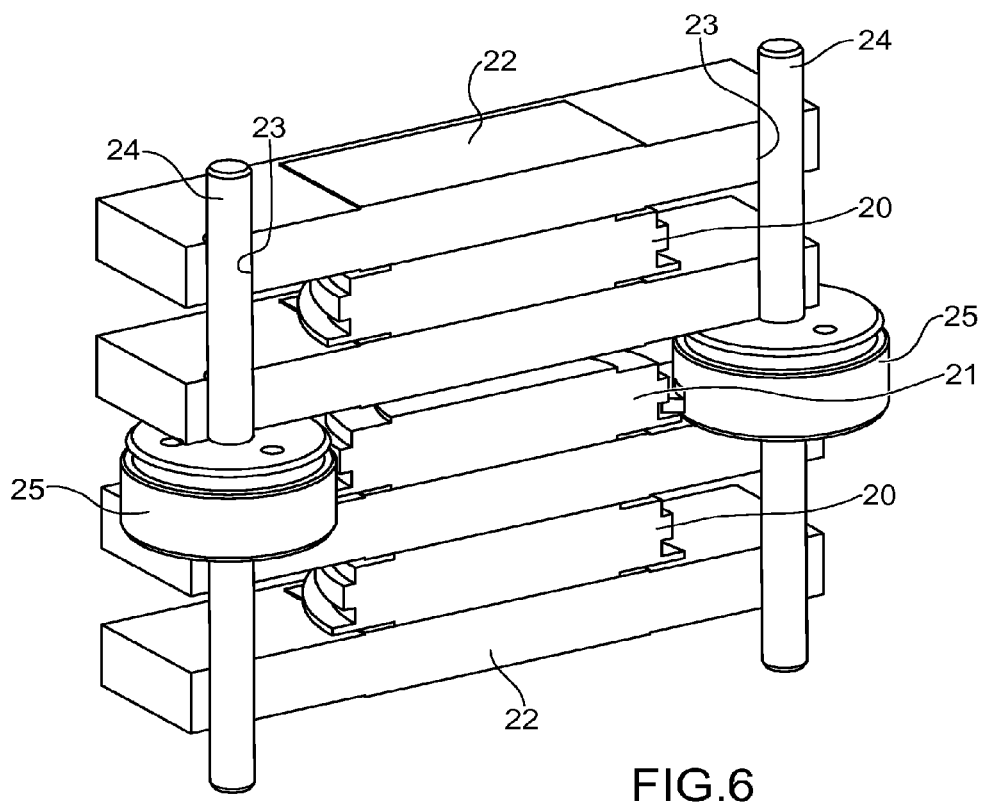
FIG. 6 shows a partial longitudinal section of the invention thyristors/heatsinks stack assembly.

The invention spreading method is such that during a faulty thyristor 21 replacement procedure in a thyristors/heatsinks stack assembly, the continuum of the alignment path of the thyristors/heatsinks stack assembly is maintained even when a faulty thyristor 21 is removed and the stack assembly is divided into two separated subassemblies. As shown on FIG. 6, each heatsink device 22 has two guide holes 23, at two opposite ends of the heatsink device. During the spreading method, two guide rods 24 are inserted through said guide holes 23, and a spreader tool 25 is placed to both sides of a faulty thyristor 21. Applying compressed medium (air or liquid) to the spreader tool 25 causes heatsinks devices 22 that are located near the faulty thyristor 21 to pull apart, freeing it for the removal and replacement. During this spreading method, alignment path is retained all the time, allowing returning of the stack assembly to the original alignment after the faulty thyristor 21 is replaced.

The invention thyristors/heatsinks stack assembly spreading method is now described more precisely.

Figure 7:
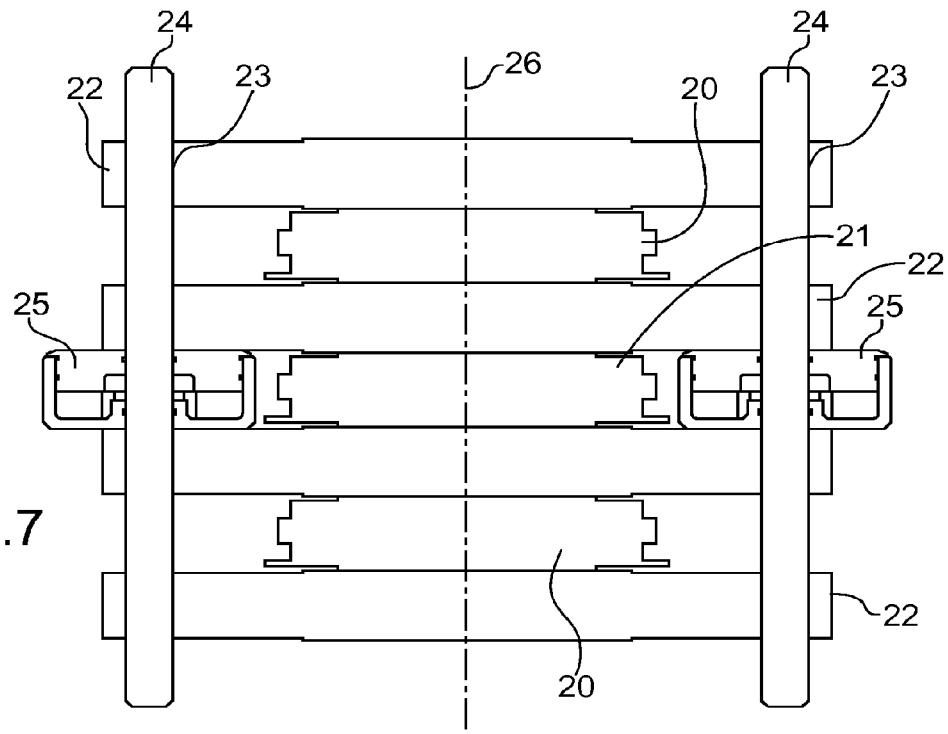
FIG. 7-FIG. 10 show the invention thyristors/heatsinks stack assembly spreading method with a continuous thyristor stack alignment path.

FIG. 7 shows thyristors/heatsinks stack assembly in its normal clamped position, prepared for the spreading method, the two guide rods 24 being inserted in the guide holes 23 and the two spreader tools 25 being arranged on both sides of the faulty thyristor 21.

Figure 8:
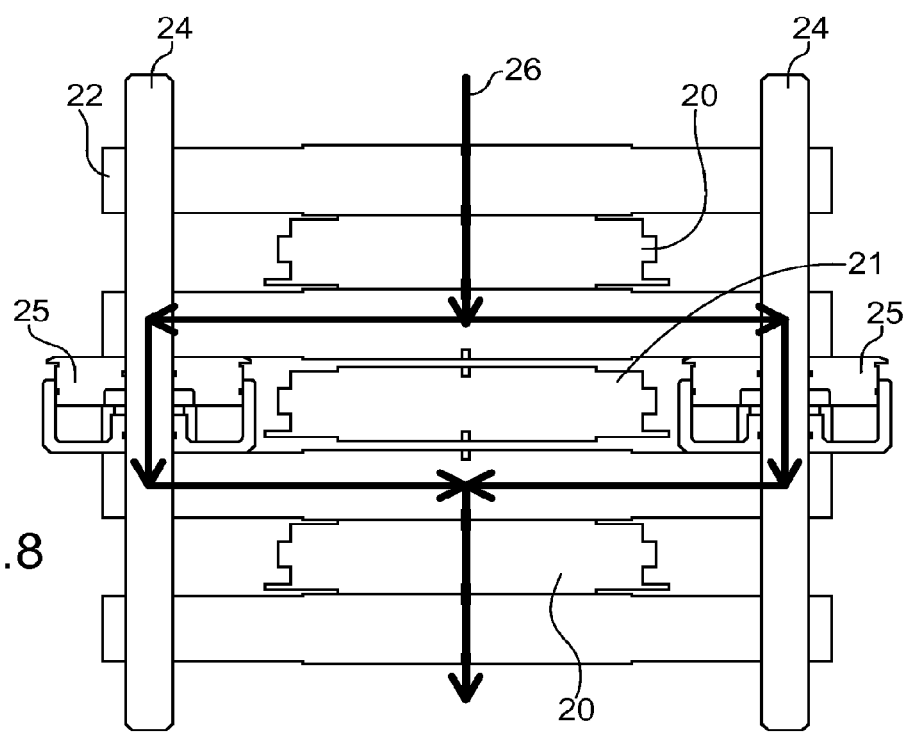

FIG. 8 shows thyristors/heatsinks stack assembly during the spreading method. The two spreader tools 25 are in the expanded position, which is a position when replacement of the faulty thyristor 21 is possible. Due to presence of the guide rods 24, the spreading method allows retention of the initial alignment of the thyristors 20 and the heatsinks 22. Force vectors remain perpendicular to the heatsinks 22 and in line with the guide rods 24 (marked as the alignment path 26).

Figure 9:
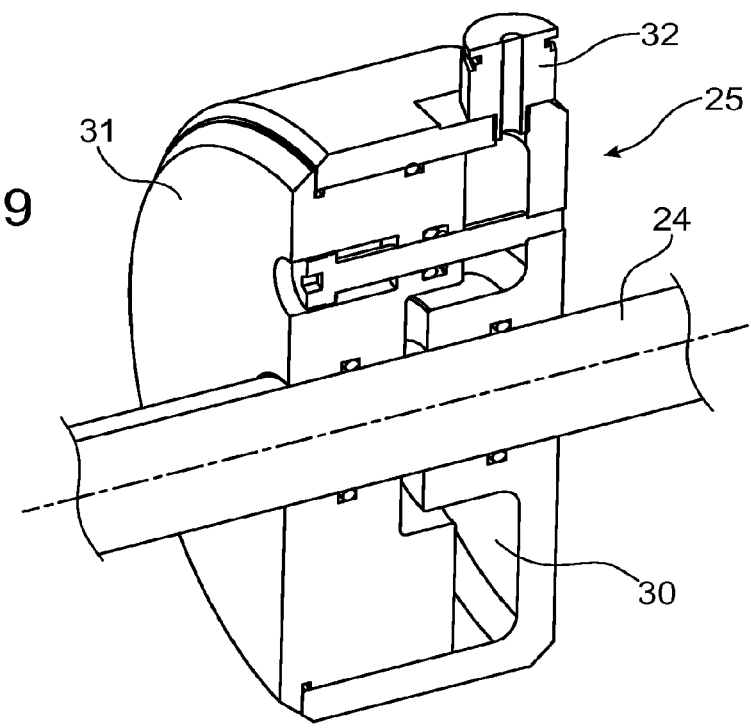
Figure 10:
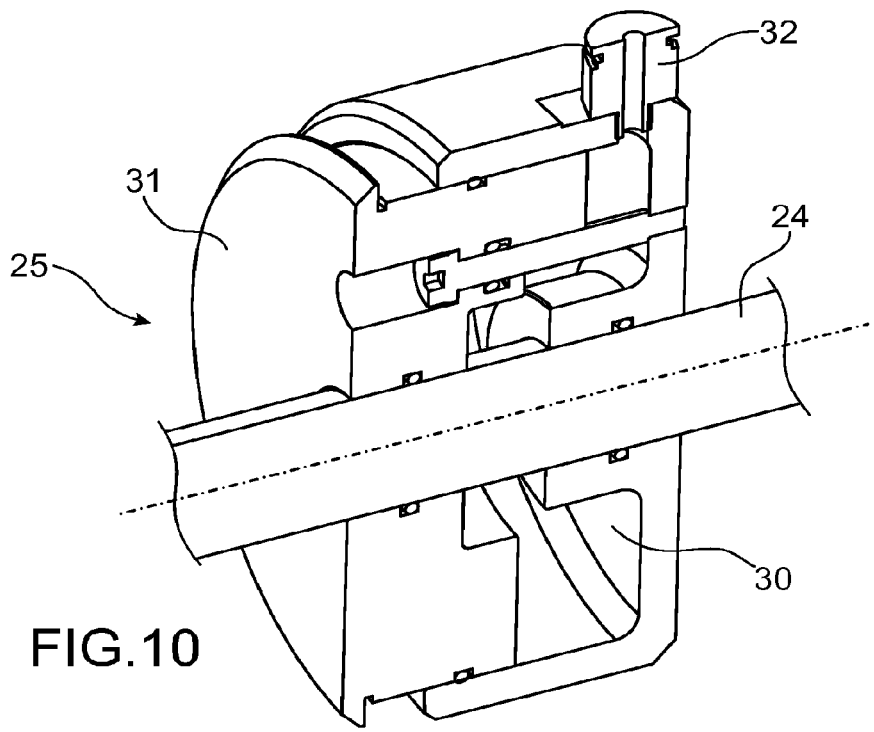

FIG. 9 shows internal design details of the spreader tool 25 in the contracted position (passive position), allowing insertion between two adjacent heatsinks 22. This spreader tool 25 comprises an air pressure chamber 30, a retractable piston 31, a compressed air input 32, and a guide axis which is the guide rod 24. FIG. 10 shows the spreader tool 25 in the expanded position (active position), spreading apart adjacent heatsinks.

Such an air actuated spreader tool 25 is a mechanical actuator that is used to provide an unidirectional stroke. Compressed air is used as medium to impart a force on the piston 31, housed within the chamber 30. In the invention, such a piston 31 use a center guide axis, which is a guide rod 24 to provide a linear guide for the movement of its stoke. This spreader tool 25 is used to separate heatsinks 22 within the thyristors/heatsinks stack assembly, providing a clearance gap for removal, and subsequent replacement of the faulty thyristor 21. Thyristor centering holes then snap back into their respective locating pins.

During this spreading method, 100% of the alignment of adjacent heatsinks 22 is maintained, all the way through until the faulty thyristor 21 is replaced and pressure from the spreader tools 25 is removed.

Thanks to the invention method, 100% control of the stack alignment provides safe and easy steps for thyristor replacement.

Embodiment of the Invention Thyristors/Heatsinks Assembly

FIG. 10 to FIG. 13 show respectively details of embodiments of the thyristors 20 (Ø1=172 mm, d=35 mm), guide rods 24 (Ø2=20 mm) and simplified drawing of the spreader tool 25 (Ø3=89.9 mm, Ø4=79.3 mm), with the chamber 30, the piston 31, three o-rings 35, 36 and 37, a compressed air input 32 and a bolt 38. The dimension e depends on thyristor 20 thickness.

The invention claimed is:

1. An assembly of devices comprising:
    one or more silicon device disks each having parallel opposing faces; and
    one or more flat heatsink devices,
    wherein the one or more silicon device disks and one or more flat heatsink devices are alternatingly stacked over one another along an alignment path that passes centrally through the silicon disk devices and normally to the parallel opposing faces such that each silicon device disk is separated from each other silicon device disk by at least one flat heatsink device,
    wherein adjacent silicon device disks and heatsink devices include centering holes for accommodating a centering pins between the adjacent devices, and
    wherein each heatsink device is pierced with two guide holes disposed diametrically opposite and equidistantly from a point of intersection of the alignment path and the pierced heatsink device.

2. The stack assembly pursuant claim 1, wherein each silicon device is a thyristor.

3. The stack assembly pursuant to claim 1, which is used in a vertical or horizontal stack configuration.

4. A method to pull apart a faulty silicon device in the silicon devices/heatsinks stack assembly as claimed in claim 1, wherein two guide rods are inserted through the guide holes, with two spreader tools placed to both sides of the faulty silicon device, and wherein compressed medium is applied to the spreader tools to cause heatsink devices that are located near the faulty silicon device to pull apart, freeing the faulty silicon device for the removal and replacement.

5. The method pursuant claim 4, wherein the compressed medium is air or a liquid.

6. The method pursuant claim 4, wherein each of the two spreader tools has a cylindrical form.

7. The method pursuant claim 6, wherein each spreader tool comprises an air pressure chamber, a retractable piston and an air input.

8. The method pursuant claim 7, wherein each spreader tool comprises a center guide axis.

9. The method pursuant claim 8, wherein the center guide axis is a guide rod.

10. The method pursuant claim 9, wherein the compressed medium is used as a medium to impart a force on the piston.

11. A method to pull apart a faulty silicon device in an assembly of devices having one or more silicon device disks each having parallel opposing faces, and
    one or more flat heatsink devices, wherein the one or more silicon device disks and one or more flat heatsink devices are alternatingly stacked over one another along an alignment path that passes centrally through the silicon disk devices and normally to the parallel opposing faces such that each silicon device disk is separated from each other silicon device disk by at least one flat heatsink device, wherein adjacent silicon device disks and heatsink devices include centering holes for accommodating a centering pins between the adjacent devices, and wherein each heatsink device is pierced with two guide holes disposed diametrically opposite and equidistantly from a point of intersection of the alignment path and the pierced heatsink device, the method comprising:
    inserting two guide rods through the guide holes, with two spreader tools placed to both sides of the faulty silicon device, and
    applying a compressed medium to the spreader tools to cause two heatsink devices closest to and on opposite sides of the faulty silicon device to pull apart, freeing the faulty silicon device for removal and replacement.

* * * * *